United States Patent [19]

Yamamoto

[11] Patent Number: 5,768,295
[45] Date of Patent: Jun. 16, 1998

[54] SYSTEM FOR PARITY CALCULATION BASED ON ARITHEMTIC DIFFERENCE BETWEEN DATA

[75] Inventor: Rieko Yamamoto, Tokyo, Japan

[73] Assignee: NEC Corporation, Tokyo, Japan

[21] Appl. No.: 401,680

[22] Filed: Mar. 10, 1995

[51] Int. Cl.$^6$ ............................................. H03M 13/00
[52] U.S. Cl. ............................ 371/37.02; 371/30
[58] Field of Search ........................... 371/49.1, 49.2, 371/49.3, 37.02, 30; 370/55, 442, 501, 538; 395/403, 449; 374/334, 202

[56] References Cited

U.S. PATENT DOCUMENTS

| | | | |
|---|---|---|---|
| 3,851,104 | 11/1974 | Willard et al. | 370/442 |
| 4,429,391 | 1/1984 | Lee | 371/49.1 |
| 4,464,717 | 8/1984 | Keeley et al. | 395/449 |
| 4,606,028 | 8/1986 | Wagenmkers | 371/49.1 |
| 4,860,282 | 8/1989 | Itoh et al. | 370/501 |
| 4,916,693 | 4/1990 | Shimada et al. | 370/538 |
| 5,018,147 | 5/1991 | Kai et al. | 371/49.1 |
| 5,033,050 | 7/1991 | Murai | 371/49.1 |
| 5,067,078 | 11/1991 | Talgam et al. | 395/403 |
| 5,151,902 | 9/1992 | Grallert | 371/5.1 |
| 5,373,533 | 12/1994 | Hayashihara et al. | 375/334 |
| 5,381,443 | 1/1995 | Borth et al. | 375/202 |
| 5,465,262 | 11/1995 | Dell et al. | 371/49.3 |
| 5,483,471 | 1/1996 | Adachi | 364/602 |

*Primary Examiner*—Reba I. Elmore
*Assistant Examiner*—McDiennel Marc
*Attorney, Agent, or Firm*—Whitham, Curtis & Whitham

[57] ABSTRACT

A communication system uses a main signal having a plurality of signal frames each of which has first data and a first monitor bit. The first monitor bit in one of the signal frames is determined by the first data in a preceding signal frame which next precedes the one of the signal frames. A data inserting device inserts second data into the main signal. A monitor bit producing device produces a second monitor bit in response to the first and the second data and the first monitor bit. The second monitor bit holds monitor data which have data of first monitor bits which are held in preceding signal frames which precede the one of the signal frames. A monitor bit changing device changes the first monitor bit into the second monitor bit in the one of the signal frames.

3 Claims, 10 Drawing Sheets

1
SYSTEM FOR PARITY CALCULATION BASED ON ARITHEMTIC DIFFERENCE BETWEEN DATA

BACKGROUND OF THE INVENTION

The present invention relates to a transmitting system which uses a main signal having a plurality of signal frames each of which comprises a predetermined number of time slots.

In the manner which will later be described more in detail, a conventional communication system comprises a transmitting system, a receiving system, a data producing system, a data inserting device, a monitor bit producing device, a monitor bit changing device, and a monitor bit judging device.

The transmitting system transmits a main signal comprising a plurality of signal frames each of which has first data having a first data value and a first monitor bit having a first monitor bit value. The data producing device produces second data having a second data value and supplies the second data to the data inserting device. The data inserting device is supplied with the main signal and the second data and inserts the second data into the main signal to produce a data inserted main signal which comprises the first monitor bit and third data having a third data value.

The monitor bit producing device is supplied with the data inserted main signal and produces a second monitor bit in response to the third data. The monitor bit producing device supplies the second monitor bit to the monitor bit changing device. The monitor bit changing device is supplied with the data inserted main signal and the second monitor bit and changes the first monitor bit into the second monitor bit in one of the signal frames of the data inserted main signal.

The monitor bit judging device is supplied with the main signal from the transmitting system. The monitor bit judging device comprises a monitor bit detecting device, a parity calculating device, a delay circuit, and a comparing device. The monitor bit detecting device is supplied with the main signal and detects the first monitor bit of one of the signal frames in the main signal. The parity calculating devise is supplied with the main signal and calculates the first data value to produce a parity calculated signal. The delay circuit is supplied with the parity calculated signal and delays the parity calculated signal by a delay time in which the one of the signal frames proceeds. The delay circuit produces a parity delayed signal and supplies the parity delayed signal to the comparing device. The comparing device is supplied with the first monitor bit and the parity delayed signal to produce a parity compared bit. The parity compared bit inserting device is supplied with the parity compared bit and inserts the parity compared bit into the main signal.

The receiving system comprises a receiving device and a parity checking device. The receiving device is supplied with the data inserted main signal as a received main signal. The parity checking device checks parity on the received main signal. The parity checking device comprises a first parity checking circuit and a second parity checking circuit. The first parity checking circuit checks the second monitor bit of the received main signal. The second parity checking circuit checks the parity compared bit of the received main signal.

This conventional communication system needs the monitor bit judging device, the parity compared bit inserting device, and the second parity checking circuit. As a result, this communication system has a large size.

SUMMARY OF THE INVENTION

It is therefore an object of the invention to provide a communication system which has a small size.

Other objects of this invention will become clear as the description proceeds.

According to an aspect of this invention, there is provided a communication system which uses a main signal having a plurality of signal frames each of which comprises a predetermined number of time slots, each of the signal framed having first data and a first monitor bit representing a parity bit, the first monitor bit in one of the signal frames being determined by the first data in a preceding signal frame which next precedes the one of the signal frames. The communication system comprises; (A) a data inserting device for receiving the main signal to insert second data into the main signal; (B) a monitor bit producing device for producing a second monitor bit in response to the first and the second data and the first monitor bit when the monitor bit producing device is supplied with the one of the signal frames and the second data, the second monitor bit representing the parity bit, the second monitor bit holding monitor data which have data of the first monitor bits which are held in preceding signal frames which precede the one of the signal frames; and (C) a monitor bit changing device for changing the first monitor bit into the second monitor bit in the one of the signal frames when the monitor bit changing device is supplied with the second monitor bit and the one of the signal frames.

According to an aspect of this invention, there is provided a communication system which comprises: (A) a transmitting device for transmitting a transmit signal having a plurality of signal frames each of which comprises a predetermined number of time slots, each of the signal frames having first data; (B) a first monitor bit producing device for producing a first monitor bit in one of the signal frames in response to the first data in a preceding signal frame which next precedes the one of the signal frames, the first monitor bit representing a parity bit; (C) a monitor bit inserting device for receiving the first monitor bit to insert the first monitor bit into a particular time slot of the one of the signal frames and to produce a main signal having the first data and the first monitor bit; (D) a data inserting device for receiving the main signal and second data to insert second data into the main signal and to produce a data inserted main signal having the first monitor bit and third data; (E) a second monitor bit producing device for producing a second monitor bit in response to the first and the second data and the first monitor bit when the second monitor bit producing device is supplied with the one of the signal frames and second data, the second monitor bit representing the parity bit, the second monitor bit holding monitor data which have data of the first monitor bits which are held in preceding signal frames which precede the one of the signal frames: (F) a monitor bit changing device for changing the first monitor bit into the second monitor bit in the one of the signal frames when the monitor bit changing device is supplied with the second monitor bit and the one of the signal frames, the monitor bit changing device producing a data monitor inserted main signal; (G) a receiving device for receiving the data monitor inserted main signal as a received main signal; and (H) a parity checking device for checking parity on the received main signal.

DESCRIPTION OF THE PREFERRED EMBODIMENT

Figure 1:
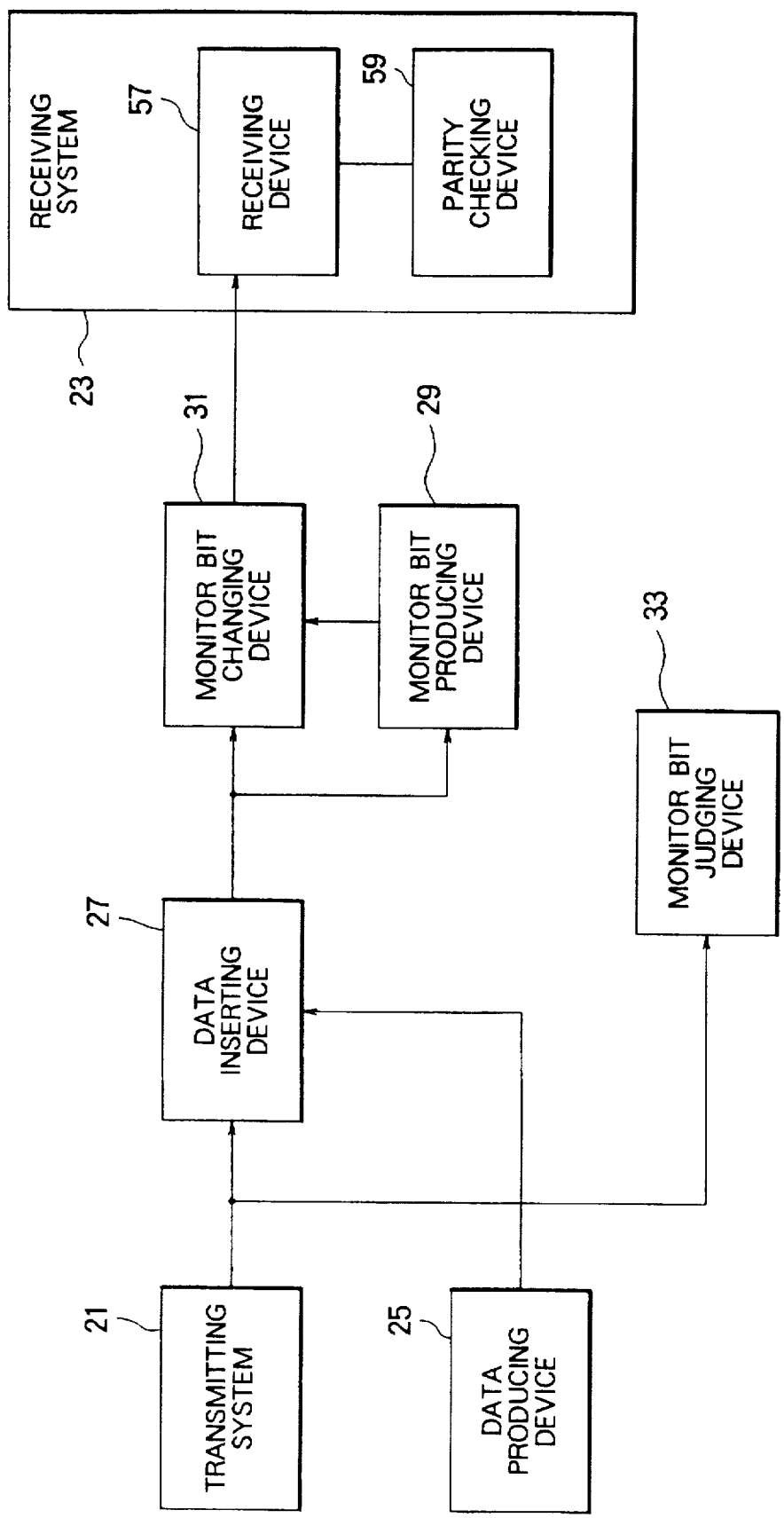
FIG. 1 is a block diagram of a conventional communication system.
Figure 2:
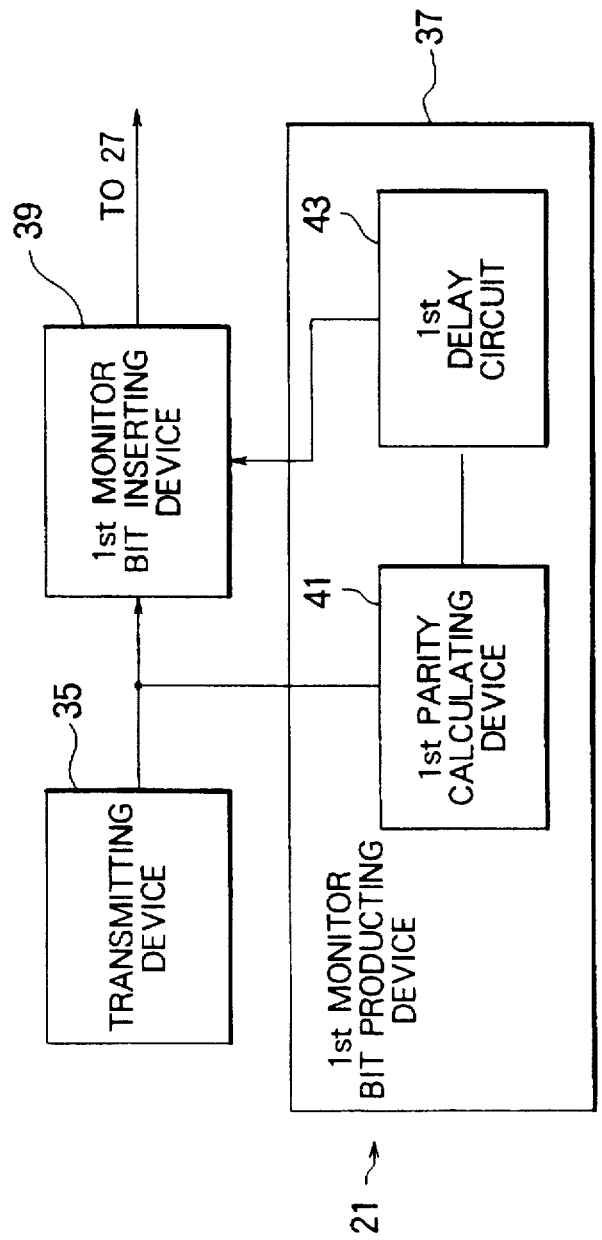
FIG. 2 is a block diagram of a first part of the conventional communication system illustrated in FIG. 1.

Referring to FIGS. 1 to 5, a conventional communication system will be described for a better understanding of this invention. In FIGS. 1 and 2, the conventional communication system comprises a transmitting system 21, a receiving system 23, a data producing device 25, a data inserting device 27, a monitor bit producing device 29, a monitor bit changing device 31, and a monitor bit judging device 33.

Figure 3:
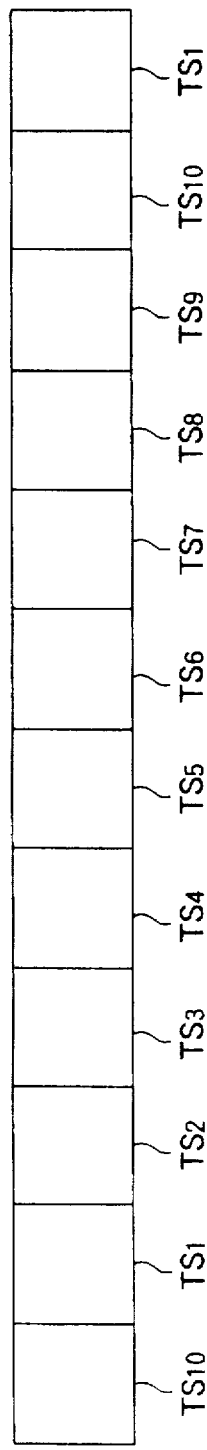
FIG. 3 is a view for use in describing operation of the conventional communication system illustrated in FIG. 1.

The transmitting system 21 comprises a transmitting device 35, a first monitor bit producing device 37 connected to the transmitting device 35 and a first monitor bit inserting device 39 connected between the transmitting device 35 and the first monitor bit producing device 37. The transmitting device 35 transmits a transmit signal having a plurality of signal frames. Each of the signal frames has a predetermined number of time slots. For example, as shown in FIG. 3, each of the signal frames has first through tenth time slots $TS_1$ to $TS_{10}$. First data and a first monitor bit are inserted into the time slots of one of the signal frames. The first data comprises logic high levels "1" logic low levels "0". Also, the first monitor bit has a logic high level "1" or a logic low level "0". The first data in the signal frames has the first data value. The first monitor bit is a parity bit and has a first monitor bit value.

In FIG. 2, the first monitor bit producing device 37 comprises a first parity calculating device 41 connected to the transmitting device 35, a first delay circuit 43 connected to the first parity calculating device 31 and the first monitor bit inserting device 39.

The first parity calculating device 41 is supplied with the first data of the transmit signal from the transmitting device 35 and processes calculates the first data value to produce a first parity calculated signal. More specifically, the first parity calculating device 41 calculates the number of the logic high level "1" of one of the signal frames to produce the first parity calculated signal having a first parity calculated value. The first delay circuit 43 is supplied with the first parity calculated signal and delays the first parity calculated signal by a delay time in which the one of the signal frames proceeds. The first delay circuit 43 produces a first parity delayed signal as the first monitor bit and supplies the first monitor bit to the first monitor bit inserting device 39. The first monitor bit inserting device 39 is supplied with the transmit signal and the first monitor hit and inserts the first monitor bit into the transmit signal to produce a main signal. More specifically, the first monitor bit inserting device 39 inserts the first monitor bit a particular time slot of a following signal frame which next follows one of the signal frames that is supplied to the first parity calculating circuit 41. As a result, the transmitting system 21 transmits the main signal comprising the signal frames each of which has the first data and the first monitor bit.

Turning back to FIG. 1, the data inserting device 27 is connected to the transmitting system 21 and the data producing device 25. The data producing device 25 produces second data and supplies the second data to the data inserting device 27. The transmitting system 21 supplies the main signal to the data inserting device 27. The data inserting device 27 inserts the second data into the main signal to produce a data inserted main signal having third data and the first monitor bit.

The monitor bit changing device 31 is connected to the monitor bit producing device 29 and the data inserting device 21. The monitor bit changing device 31 is supplied with the data inserted main signal from the data inserting device 27 and a second monitor bit from the monitor bit producing device 29. The monitor bit changing device 31 changes the first monitor bit into the second monitor bit in the one of the signal frames when the monitor bit changing device 29 is supplied with the second monitor bit and the one of the signal frames of the data inserted main signal. The monitor bit changing device 31 produces a data monitor inserted main signal which has the third data having a third data value and the second monitor bit having a second monitor bit value.

Figure 4:
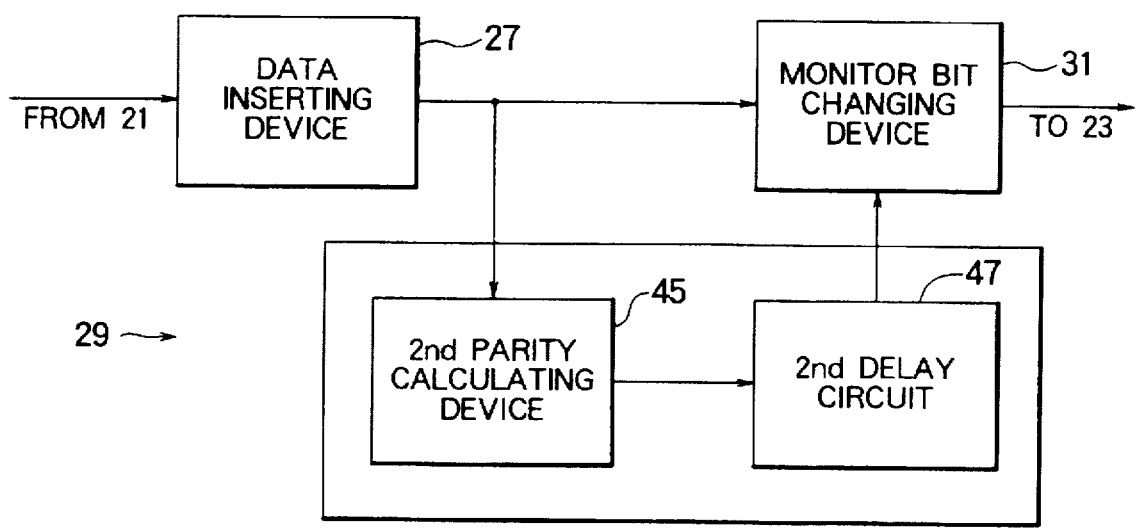
FIG. 4 is a block diagram of a second part of the conventional communication system illustrated in FIG. 1.

In FIG. 4, the monitor bit producing device 29 comprises a second parity calculating device 45 connected to the data inserting device 27 and a second delay circuit 47 connected to the second parity calculating device 45 and the monitor bit changing device 31.

The second parity calculating device 45 is supplied with the third data of the data inserted main signal from the data inserting device 27 and calculates the third data value to produce a second parity calculated signal. More specifically, the second parity calculating device 45 calculates the number of the logic level "1" of the one of the signal frames in the second parity calculated signal to produce the second parity calculated signal having a second parity calculated value. The second delay circuit 47 is supplied with the second parity calculated signal and delays the second parity calculated signal by the delay time in which the one of the signal frames proceeds. The second delay circuit 47 produces a second parity delayed signal as the second monitor bit and supplies the second monitor bit to the monitor bit Changing device 31.

Figure 5:
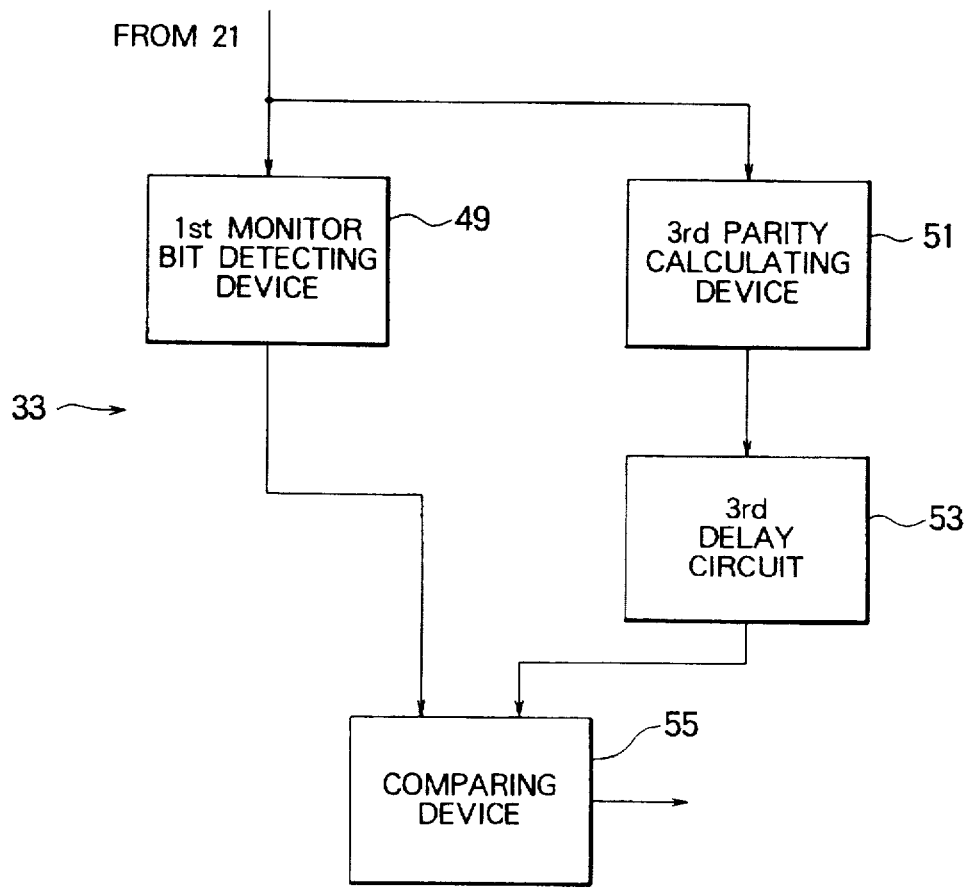
FIG. 5 is a block diagram of a third part of the conventional communication system illustrated in FIG. 1.
Figure 6:
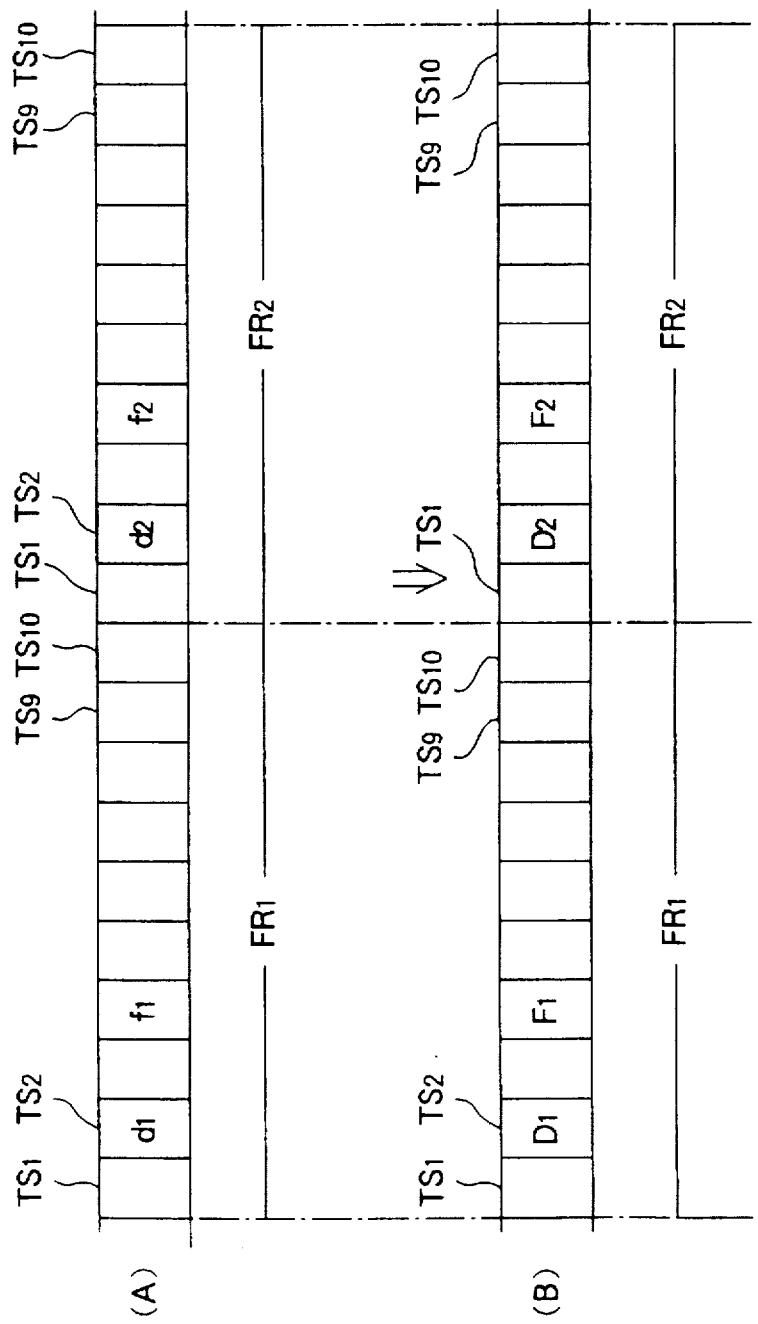
FIGS. 6(A) and (B) are views for use in describing operation of a communication system according to an embodiment of this invention.

In FIG. 5, the monitor bit judging device 33 comprises a first monitor bit detecting device 49 connected to the transmitting system 21, a third parity calculating device 51 connected to the transmitting system 21, a third delay circuit 53 connected to the third parity calculating device 51, and a comparing device 55 connected to the first monitor bit detecting device 49 and the third delay circuit 53.

The first monitor bit detecting device 49 is supplied with the main signal from the transmitting system 21. The first monitor bit detecting device 49 detects the first monitor bit of the one of the signal frames in the main signal to supply the first monitor bit to the comparing device 55. The third parity calculating device 51 is supplied with the main signal from the transmitting system 21 and calculates the first data value to produce the first parity calculated signal. The third delay circuit 53 is supplied with the first parity calculated signal and delays the first parity calculated signal by the delay time in which the one of the signal frames proceeds. The third delay circuit 53 produces the first parity delayed signal and supplies the first parity delayed signal to the comparing device 55. The comparing device 55 is supplied with the first monitor bit and the first parity delayed signal and compares the first monitor bit with the first parity delayed signal to produce a parity compared bit. A parity compared bit inserting device (not shown) is supplied with the parity compared bit and inserts the parity compared bit into the main signal.

Turning back to FIG. 1, the receiving system 23 is connected to the monitor bit changing device 31. The receiving system 23 comprises a receiving device 57 connected to the monitor bit changing device 31 and a parity checking device 59 connected to the receiving device 57. The receiving device 57 is supplied with the data monitor inserted main signal as a received main signal from the monitor bit changing device 31. The parity checking device 59 is supplied with the received main signal from the receiving device 57 and checks parity on the received main signal. The parity checking device 59 comprises a first parity checking circuit (not shown) and a second parity checking circuit (not shown). The first parity checking circuit checks the second monitor bit of the received main signal. The second parity checking circuit checks the parity compared bit of the received main signal.

This conventional communication system needs the monitor bit judging device, the parity compared bit inserting device, and the second parity checking circuit. As a result, this conventional communication system has a large size.

Referring to FIGS. 6 to 11, the description will proceed to a communication system according to an embodiment of this invention. Similar parts are designated by like reference numerals.

In FIG. 6(A), it will be assumed that one $FR_1$ of the signal frames of a first signal has data having a data value $d_1$ and a monitor bit having a monitor bit value $f_1$, and that a signal frame $FR_2$ of the first signal has data having a data value $d_2$ and a monitor bit having a monitor bit value $f_2$. The signal frame $FR_2$ (next) follows the signal frame $FR_1$. As shown in FIG. 6(B), the signal frame $FR_1$ of a second signal has data having a data value $D_1$ and a monitor bit having a monitor bit value $F_1$. Likewise, the signal frame $FR_2$ of the second signal has data having a data value $D_2$ and a monitor bit having a monitor bit value $F_2$. The monitor bit value $F_2$ is represented by a following equation (1).

$$F_2 = f_2 - d_1 - f_1 + D_1 + F_1 \quad (1)$$

It will be assumed that a signal frame $FR_n$ of the second signal has a monitor bit having a monitor bit value $F_n$, where n represents an integer greater than one. The monitor bit value $F_n$ is represented by a following equation (2) based on the equation (1).

$$F_n = f_n - d_{(n-1)} - f_{(n-1)} + D_{(n-1)} + F_{(n-1)} \quad (2)$$

This invention is based on the equation (2).

Figure 7:
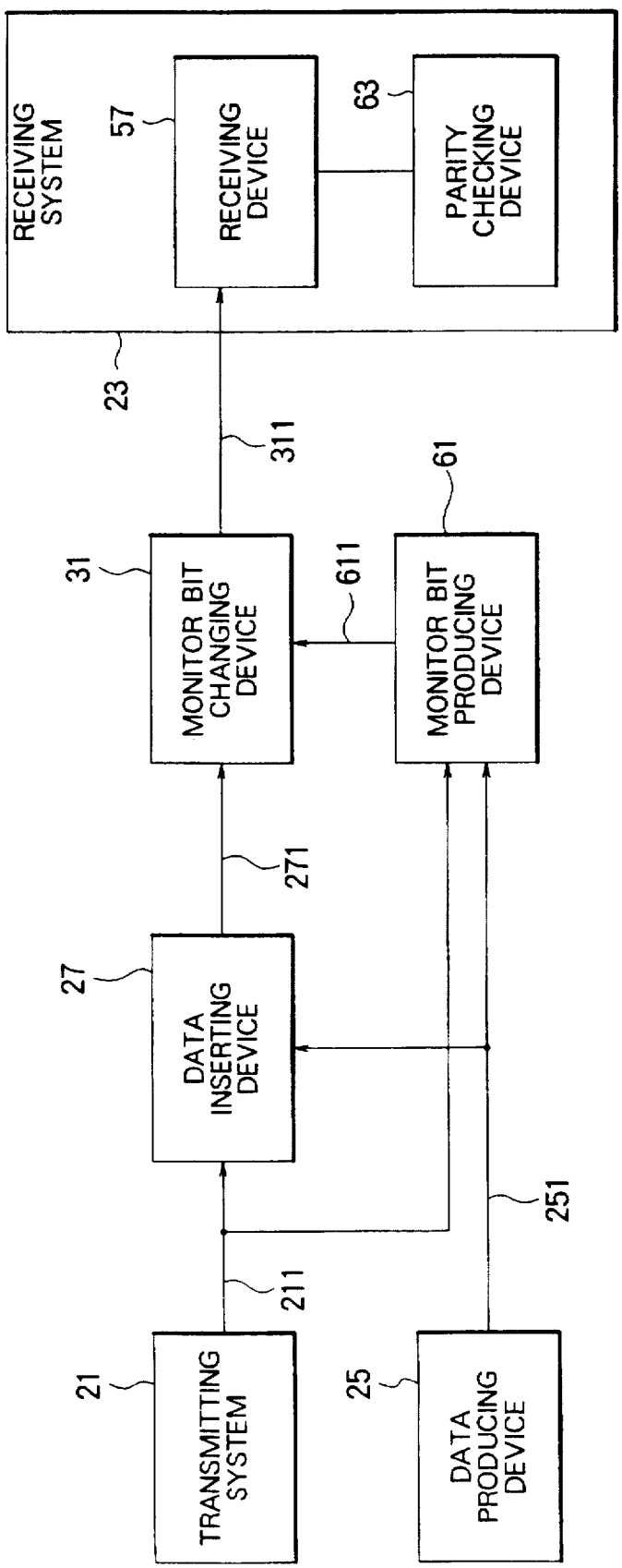
FIG. 7 is a block diagram of the communication system according to the embodiment of this invention.

In FIG. 7, the communication system comprises the transmitting system 21, the receiving system 23, the data producing device 25, the data inserting device 27, the monitor changing device 31, and a monitor bit producing device 61. The receiving system 23 comprises the receiving device 57 and a parity checking device 63 connected to the receiving device 57.

The monitor bit producing device 61 is connected to the transmitting system 21, the data producing device 25, and the monitor bit changing device 31. The monitor bit producing device 61 produces a third monitor bit in response to the first and the second data and the first monitor bit when the monitor bit producing device 61 is supplied with one of the signal frames of the main signal from the transmitting system 11 and the second data from the data producing device 25. The third monitor bit represents the parity bit. The third monitor bit holds monitor data which have data of the first monitor bits which are held in preceding signal frames which precede the one of the signal frames. The monitor bit changing device 31 is supplied with the data inserted main signal from the data inserting device 27 and the third monitor bit from the monitor bit producing device 61. The monitor bit changing device 31 changes the first monitor bit into the third monitor bit in the one of the signal frames of the data inserted main signal to produce and supply the data monitor inserted main signal having the third data and the third monitor bit to the receiving device 23.

The transmitting system 21 outputs the main signal 211. The data producing device 25 outputs the second data 251. The inserting device 27 outputs the data inserted main signal 271. The monitor bit producing device 61 outputs the third monitor bit 611. The monitor bit changing device 31 outputs the data monitor inserted main signal 311.

Referring to FIGS. 8 to 11, the description will proceed to the monitor bit producing device 61.

Figure 8:
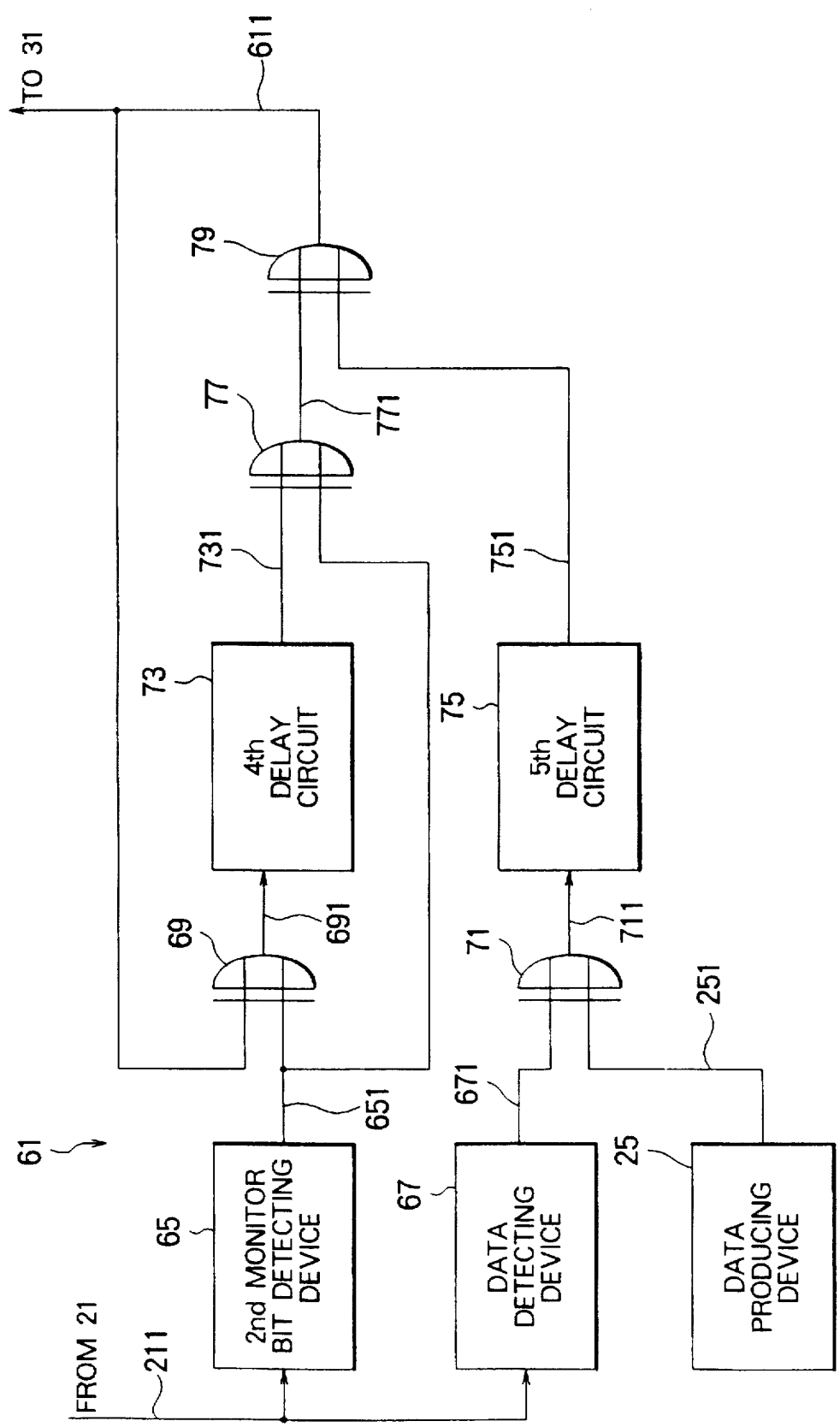
FIG. 8 is a block diagram of a part of the communication system illustrated in FIG. 7.

In FIG. 8, the monitor bit producing device 61 comprises a second monitor bit detecting device 65, a data detecting device 67, a first exclusive OR circuit 69, a second exclusive OR circuit 71, a fourth delay circuit 73, a fifth delay circuit 75, a third exclusive OR circuit 77, and a fourth exclusive OR circuit 79.

The second monitor bit detecting device 65 is connected to the transmitting system 21 and is supplied with the main signal 211. The data detecting device 67 is connected to the transmitting system 21 and is supplied with the main signal from the transmitting system 21. The first exclusive OR circuit 69 has a first input terminal connected to the second monitor bit detecting device 65 and a second input terminal connected to an output terminal of the fourth exclusive OR circuit 79. The second exclusive OR circuit 71 has a first input terminal connected to the data detecting device 67 and a second input terminal connected to the data producing device 25.

The fourth delay circuit 73 has an input terminal connected to an output terminal of the first exclusive OR circuit 69. The fifth delay circuit 75 has an input terminal connected to an output terminal of tie second exclusive OR circuit 71. The third exclusive OR circuit 77 has a first input terminal connected to an output terminal of the fourth delay circuit 73 and a second input terminal connected to the second monitor bit detecting device 65. The fourth exclusive OR circuit 79 has a first input terminal connected to an output terminal of the third exclusive OR circuit 77 and a second input terminal connected to an output terminal of the fifth delay circuit 75. The fourth exclusive OR circuit 79 has the output terminal connected to the monitor bit changing device 31 and the second input terminal of the first exclusive OR circuit 69. The fourth exclusive OR circuit 79 supplies the third monitor bit to the monitor changing device 31 and the first exclusive OR circuit 69.

The second monitor bit detecting device 65 detects the first monitor bit of the main signal to supply the first monitor bit 651 to the first exclusive OR circuit 69 and the third exclusive OR circuit 17. The data value detecting device 67 detects the first data of the main signal 211 to supply the first data 671 to the second exclusive OR circuit 71. The first exclusive OR circuit 69 is supplied with the third monitor bit 611 as a first exclusive sum signal and the first monitor bit 651 to produce a first exclusive difference signal 691. The second exclusive OR circuit 71 is supplied with the first data 671 and the second data 251 to produce a second exclusive difference signal 711.

The fourth delay circuit 73 is supplied with the first exclusive difference signal 691 and delays the first exclusive difference signal 691 by the delay time in which the one of the signal frames proceeds to produce a first delayed difference signal 731. The fifth delay circuit 75 is supplied with the second exclusive difference signal 711 and delays the second exclusive difference signal 711 by the delay time to produce a second delayed difference signal 751. The third exclusive OR circuit 77 is supplied with the first delayed difference signal 731 and the first monitor bit 651 to produce a second exclusive sum signal 171. The fourth exclusive OR circuit 79 is supplied with the second exclusive sum signal 771 and the second delayed difference signal 751 to produce the first exclusive sum signal as the third monitor bit 611.

Figure 9:
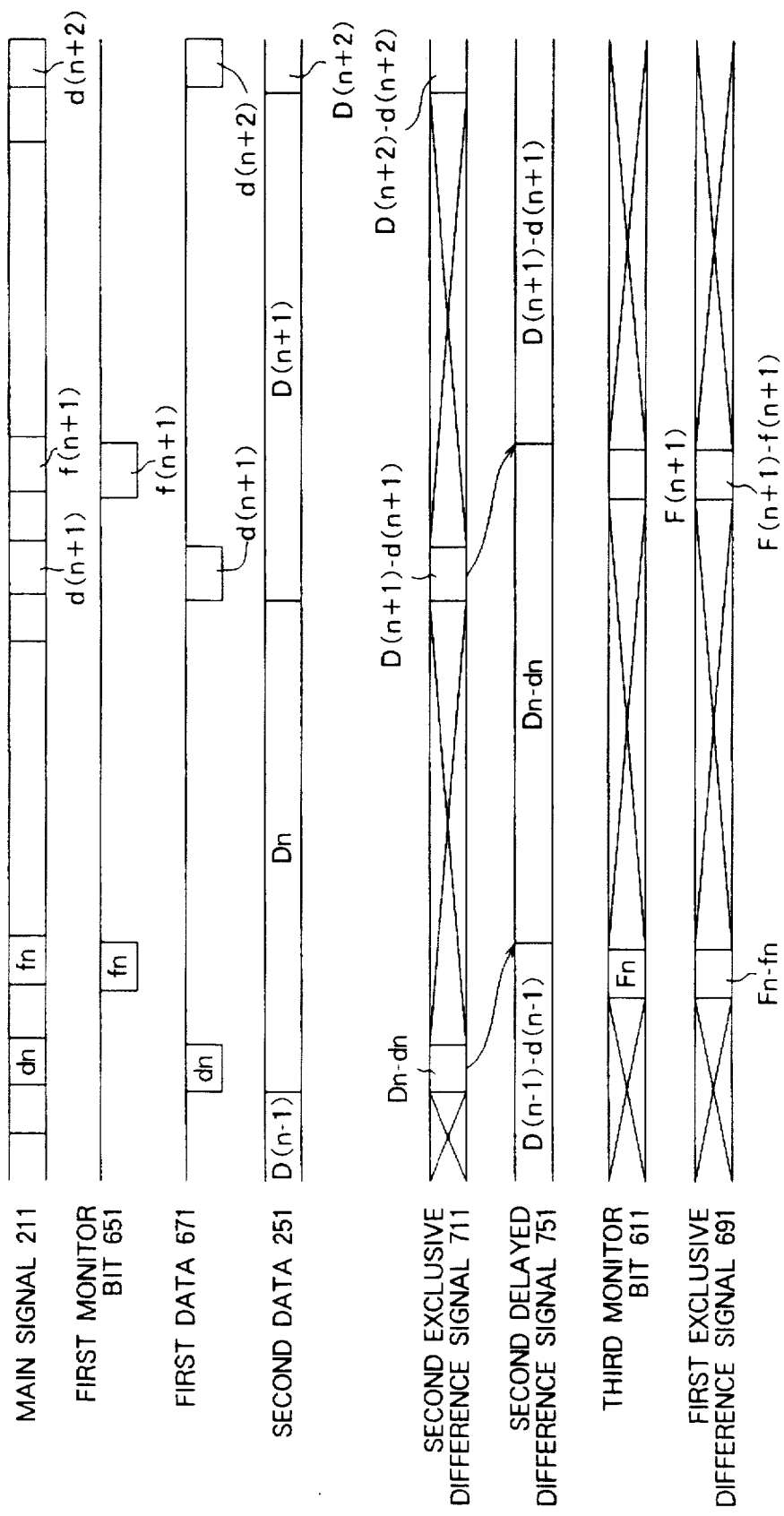
FIGS. 9, 10, and 11 are views for use in describing operation of the communication system illustrated in FIG. 7.
Figure 10:
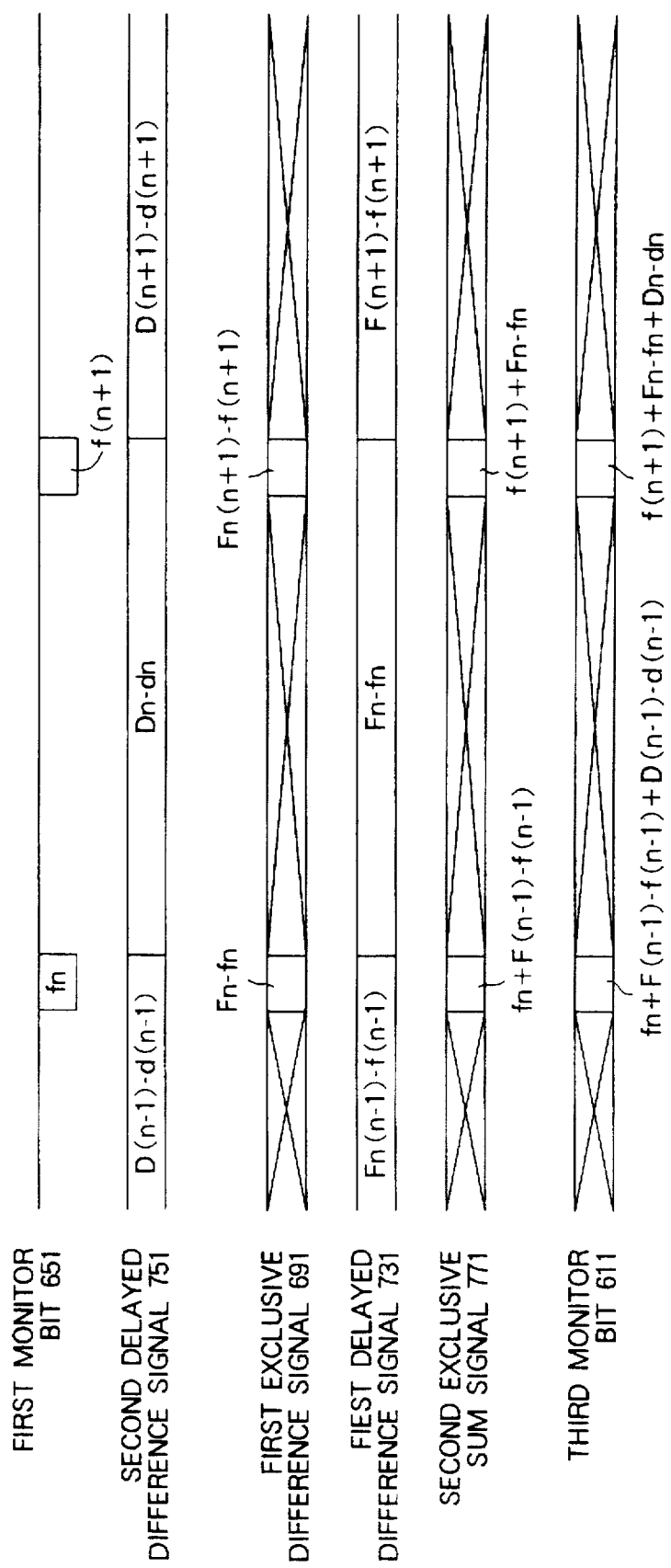
Figure 11:
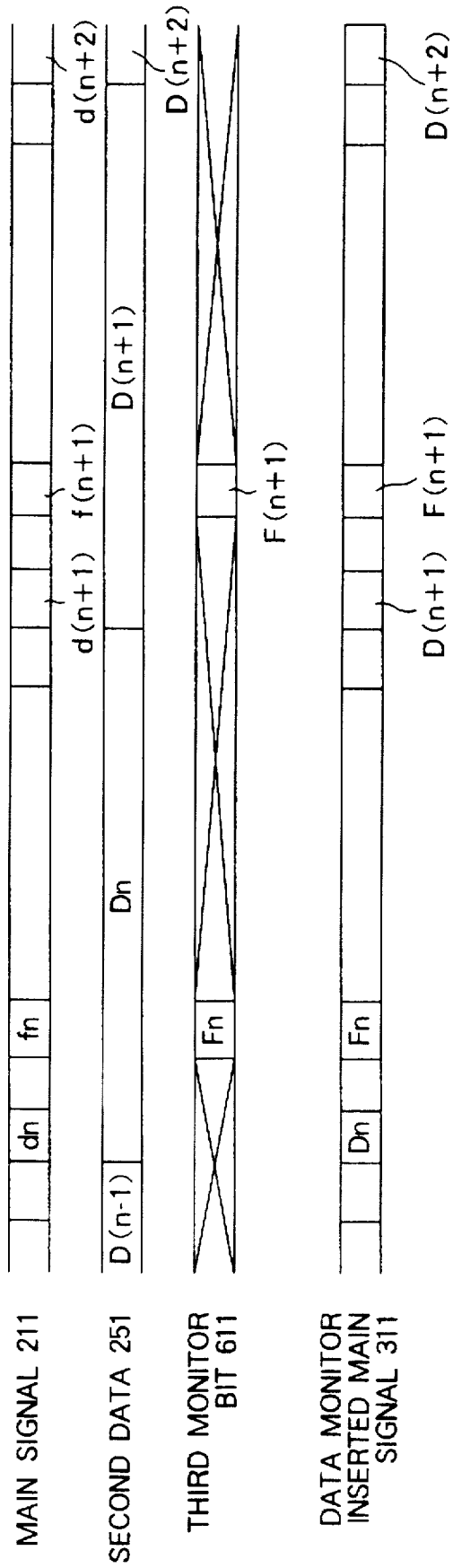

As shown in FIGS. 9 to 11, it will be assumed that the third monitor bit 611 has a third monitor bit value $F_n$, the first monitor bit 651 has a first monitor bit value $f_n$, the first data 671 has a first data value $d_n$, and the second data 251 has a second data value $D_n$.

In this event, the first exclusive difference signal 691 has a first exclusive difference value $(F_n-f_n)$ representing a first difference between the third monitor bit value $F_n$ and the first monitor bit value $f_n$. The second exclusive difference signal 711 has a second exclusive difference value $(D_n-d_n)$ representing a second difference between the second data value $D_n$ and the first data value $d_n$.

The first delayed difference signal 731 has a second exclusive difference value $(F_{(n-1)}-f_{(n-1)})$. The second delayed difference signal 751 has a second exclusive difference value $(D_{(n-1)}-d_{(n-1)})$. The second exclusive sum signal 771 has a second exclusive sum value $(f_n+F_{(n-1)}-f_{(n-1)})$ representing a second sum of the first exclusive difference value $(F_{(n-1)}-f_{(n-1)})$ and the first monitor bit value $f_n$. The first exclusive sun signal (the third monitor bit) 611 has a first exclusive sum value $(f_n+F_{(n-1)}-f_{(n-1)}+D_{(n-1)}-d_{(n-1)})$ representing a first exclusive sum of the second exclusive sum value $(f_n+F_{(n-1)}-f_{(n-1)})$ and the second exclusive difference value $(D_{(n-1)}-d_{(n-1)})$. The first exclusive sum value $(f_n+F_{(n-1)}-f_{(n-1)}+D_{(n-1)}-d_{(n-1)})$ is equal to the third monitor bit value.

Turning back to FIG. 7, the receiving system 23 comprises the receiving device 57 and the parity checking device 63 connected to the receiving device 57. The receiving device 57 is supplied with the data monitor inserted signal 311 as the received main signal. The parity checking device 63 is supplied with the received main signal and checks parity of the received main signal The parity checking device 63 comprises a parity checking circuit (not shown) which checks the third monitor bit of the received main signal.

What is claimed is:

1. A communication system which uses a main signal having a plurality of signal frames each of which comprises a predetermined number of time slots, each of said signal frames having a first data and a first monitor bit representing a parity bit, said first monitor bit in one of said signal frames being determined by said first data in a preceding signal frame which next precedes said one of the signal frames, said communication system comprising:

a data inserting device for receiving said main signal and for receiving a second data and for inserting said second data into said main signal and for producing data-inserted signal frames in response, second data having a second data value into said main signal;

a monitor bit producing device for producing a second monitor bit representing a parity bit, said second monitor bit having a value based on said first and second data values and said first monitor bit; and a monitor bit changing device for receiving said second monitor bit and one of said data-inserted signal frames and for changing said first monitor bit into said second monitor bit in said one of the data-inserted signal frames, wherein said monitor bit producing device comprises:

a first monitor bit producing device for detecting said first monitor bit of said main signal and for producing a first monitor bit value based on said detection;

a first data detecting device for detecting said first data of said main signal and for outputting said first data having a first data value based on said detection;

a first exclusive OR circuit for receiving a an interim exclusive OR output and said first monitor bit value and for producing a first difference signal, said first difference signal having value equal to said first monitor bit value minus said interim exclusive OR output data;

a second exclusive OR circuit for receiving said second data and said first data and for producing a second difference signal, said second difference signal having a value equal to said first data minus said second data;

a first delay circuit for delaying said first difference signal and for producing, based on said delaying, a first delayed difference signal having a value equal to said value of said first difference signal;

a second delay circuit for delaying said second difference signal and for producing, based on said delaying, a second delayed difference signal having a value equal to the value of said second difference signal;

a third exclusive OR circuit for receiving said first delayed difference signal and said first monitor bit and for producing a third difference signal, said third difference signal having a value equal to said first monitor bit minus a value of said first delayed difference signal; and a fourth exclusive OR circuit for receiving said third difference signal and said second delayed difference signal for producing said interim exclusive OR output in response, wherein said interim exclusive OR output is said second monitor bit.

2. A communication system comprising:

a transmitting device for transmitting a transmit signal having a plurality of signal frames each of which comprises a predetermined number of time slots, each of said signal frames having a first data;

a first monitor bit producing device for producing a first monitor bit in one of said signal frames in response to said first data in a preceding signal frame which next precedes said one of the signal frames, said first monitor bit representing a parity bit;

a monitor bit inserting device for receiving said first monitor bit and for inserting said first monitor bit into a particular time slot of said one of the signal frames and for outputting a main signal having said first data and the inserted first monitor bit;

a data inserting device for receiving said main signal and said second data and for inserting said second data into said main signal and producing a data inserted main signal having the first monitor bit and a third data, said third data based on said first data and said second data;

a second monitor bit producing device for producing a second monitor bit representing a parity bit, said second monitor bit having a value based on said first and second data values and said first monitor bit;

a monitor bit changing device for receiving said second monitor bit and said one of the signal frames and for changing said first monitor bit into said second monitor bit in one of the signal frames of said data-inserted main signal;

a parity checking device for checking a parity on said received main signal, wherein said second monitor bit producing device comprises:

a first monitor bit value producing device for detecting said first monitor bit of said main signal and for producing a first monitor bit value based on said detecting;

a first data detecting device for detecting said first data of said main signal and for outputting said first data having a first data value based on said detecting;

a first exclusive OR circuit for receiving a first exclusive sum signal having a first exclusive sum value and said first monitor bit to produce a first exclusive difference signal having a first exclusive difference value representing a first difference between said first exclusive sum value and said first monitor bit value;

a second exclusive OR circuit for receiving said second data having a second data value and said first data to produce a second exclusive difference signal having a second exclusive difference value representing a second difference between said second data value and said first data value;

a first delay circuit for delaying said first exclusive difference signal and for producing, according to said delaying, a first delayed difference signal having said first exclusive difference value;

a second delay circuit for delaying said second exclusive difference signal and for producing, according to said delaying, a second delayed difference signal having said second exclusive difference value;

a third exclusive OR circuit for receiving said first delayed difference signal and said first monitor bit and for producing a second exclusive sum signal having a second exclusive sum value representing a second exclusive sum of said first exclusive difference value and said first monitor bit; and a fourth exclusive OR circuit for receiving said second exclusive sum signal and said second delayed difference signal to produce said first exclusive sum signal, as said second monitor bit, having said first exclusive sum value representing a first exclusive sum of said second exclusive sum value and said second exclusive difference value.

3. A communication system comprising:

means for generating, in time sequence, a plurality of signal frames, each of said signal frames having a first data and an interim monitor bit representing a parity of a data in a one of said signal frames preceding said signal frame;

a data inserting device for receiving a second data, and for inserting said second data into said signal frames, and for generating a plurality data-inserted signal frames;

a monitor bit producing device for producing a second monitor bit having a value based on the first data and the second data and the interim monitor bit; and a monitor bit changing device for receiving a second monitor bit and said data-inserted signal frames and for changing said interim monitor bit into said second monitor bit, said monitor bit producing device comprising:

means for receiving a feedback exclusive OR output and said internal monitor bit and for producing a first difference signal, said first difference signal having value equal to said internal monitor bit value minus said feedback exclusive OR output data;

means for receiving said second data and first data and for producing a second difference signal, said second difference signal having a value equal to said first data minus said second data;

a first delay circuit for delaying said first difference signal and for producing, based on said delaying, a first delayed difference signal having a value equal to said value of said first difference signal;

a second delay circuit for delaying said second difference signal and for producing, based on said delaying, a second delayed difference signal having a value equal to the value of said second difference signal;

means for receiving said first delayed difference signal and said internal monitor bit and for producing a third difference signal, said third difference signal having a value equal to said first monitor bit minus a value of said first delayed difference signal; and an exclusive OR circuit for receiving said third difference signal and said second delayed difference signal for producing said feedback exclusive OR output in response.

* * * * *